United States Patent
Baronas et al.

(10) Patent No.: US 8,970,705 B2
(45) Date of Patent: Mar. 3, 2015

(54) GRAPHICAL POWER METER FOR CONSUMER TELEVISIONS

(75) Inventors: Jean Baronas, Menlo Park, CA (US); Robert N. Blanchard, Escondido, CA (US)

(73) Assignees: Sony Corporation, Tokyo (JP); Sony Electronics Inc., Park Ridge, NJ (US)

(*) Notice: Subject to any disclaimer, the term of this patent is extended or adjusted under 35 U.S.C. 154(b) by 1452 days.

(21) Appl. No.: 12/408,623

(22) Filed: Mar. 20, 2009

(65) Prior Publication Data

US 2010/0238293 A1    Sep. 23, 2010

(51) Int. Cl.
| | |
|---|---|
| H04N 7/18 | (2006.01) |
| G01R 21/00 | (2006.01) |
| G01D 1/00 | (2006.01) |
| G01D 15/00 | (2006.01) |
| G01D 21/00 | (2006.01) |
| G01R 1/02 | (2006.01) |

(52) U.S. Cl.
CPC *G01R 21/00* (2013.01); *G01D 1/00* (2013.01); *G01D 15/00* (2013.01); *G01D 21/00* (2013.01); *G01R 1/025* (2013.01)
USPC .......................................................... 348/160

(58) Field of Classification Search
CPC .... Y02B 20/30; Y02B 60/10; Y02B 60/1242; H04N 21/443; G06F 1/3218; G06F 1/3265
USPC ........... 348/61, 189, 380, 596, 725, 730, 790, 348/794, 160; 345/63, 156, 212; 713/300, 713/320; 702/61, 62; 340/636.1, 870.02, 340/870.4; 700/295
See application file for complete search history.

(56) References Cited

U.S. PATENT DOCUMENTS

| | | | |
|---|---|---|---|
| 6,701,263 B2* | 3/2004 | Jeong | 702/60 |
| 6,943,538 B2* | 9/2005 | Choi | 324/142 |
| 6,956,500 B1* | 10/2005 | Ducharme et al. | 340/870.02 |
| 7,962,299 B2* | 6/2011 | Robertson et al. | 702/62 |
| 8,289,306 B2* | 10/2012 | Unger | 345/211 |
| 2002/0047913 A1* | 4/2002 | Ono et al. | 348/380 |
| 2002/0049550 A1* | 4/2002 | Jeong | 702/61 |
| 2002/0113907 A1* | 8/2002 | Endo et al. | 348/730 |
| 2003/0004660 A1* | 1/2003 | Hunter | 702/61 |
| 2004/0027099 A1* | 2/2004 | Fujii | 323/234 |
| 2004/0268166 A1* | 12/2004 | Farkas et al. | 713/320 |

(Continued)

FOREIGN PATENT DOCUMENTS

| | | | | |
|---|---|---|---|---|
| DE | 19711771 | * | 6/2004 | |
| JP | 2000162255 | * | 6/2000 | |
| WO | WO/00/21289 | * | 4/2000 | H04N 5/57 |

OTHER PUBLICATIONS

"Digital Media", http://www.digdia.com/ces06/ces06_photos.htm., download date Nov. 3, 2008; publication date Jan. 5, 2006, pp. 1-10.

(Continued)

*Primary Examiner* — Imad Hussain
(74) *Attorney, Agent, or Firm* — Sony Corporation

(57) ABSTRACT

A graphical power meter involving a device for measuring, in real time, an internal power consumption value corresponding to power being consumed by an electronic device; and a device for displaying a graphical representation of the real-time internal power consumption value from the measuring device to a consumer.

14 Claims, 5 Drawing Sheets

(56) References Cited

U.S. PATENT DOCUMENTS

| | | | |
|---|---|---|---|
| 2005/0157215 A1* | 7/2005 | Minnick et al. | 348/725 |
| 2005/0264482 A1* | 12/2005 | Suzuki et al. | 345/63 |
| 2005/0289360 A1* | 12/2005 | Banginwar et al. | 713/300 |
| 2005/0289363 A1* | 12/2005 | Tsirkel et al. | 713/300 |
| 2006/0006842 A1* | 1/2006 | Miskovic et al. | 320/128 |
| 2006/0101293 A1* | 5/2006 | Chandley et al. | 713/300 |
| 2006/0142900 A1* | 6/2006 | Rothman et al. | 700/295 |
| 2006/0146126 A1* | 7/2006 | Guo | 348/61 |
| 2006/0221260 A1* | 10/2006 | Fujine et al. | 348/790 |
| 2008/0018640 A1* | 1/2008 | Tada et al. | 345/212 |
| 2008/0018810 A1* | 1/2008 | Moriiwa | 348/794 |
| 2008/0162961 A1* | 7/2008 | Chen et al. | 713/320 |
| 2009/0021474 A1* | 1/2009 | Bentley et al. | 345/156 |
| 2009/0054100 A1* | 2/2009 | Ishida | 455/556.1 |
| 2009/0153736 A1* | 6/2009 | Mortensen | 348/569 |
| 2009/0164152 A1* | 6/2009 | Creus et al. | 702/63 |
| 2009/0198385 A1* | 8/2009 | Oe et al. | 700/296 |
| 2009/0219654 A1* | 9/2009 | Fitzpatrick | 361/18 |
| 2009/0244048 A1* | 10/2009 | Yamanaka | 345/212 |
| 2009/0251002 A1* | 10/2009 | Cohen et al. | 307/23 |
| 2010/0007515 A1* | 1/2010 | Ito | 340/825.36 |
| 2010/0053440 A1* | 3/2010 | Mortensen | 348/569 |
| 2010/0060479 A1* | 3/2010 | Salter | 340/870.4 |
| 2010/0141777 A1* | 6/2010 | Jin et al. | 348/189 |
| 2010/0141843 A1* | 6/2010 | Vidal | 348/578 |
| 2010/0167659 A1* | 7/2010 | Wagner | 455/67.11 |
| 2010/0205137 A1* | 8/2010 | Barsness et al. | 706/52 |
| 2011/0068941 A1* | 3/2011 | Nunomaki et al. | 340/636.1 |
| 2011/0249195 A1* | 10/2011 | Teranuma | 348/730 |
| 2011/0251807 A1* | 10/2011 | Rada et al. | 702/61 |
| 2012/0242500 A1* | 9/2012 | Hirose | 340/870.02 |

OTHER PUBLICATIONS

"Monitoring your Laptop's Battery by dummies.com: Yahoo! Tech", http://tech.yahoo.com/gd/monitoring-your-laptop-s-battery/153183; Dec. 16, 2008, pp. 1-3.

"Samsung PS-50A450 MultiSystem Plasma TV multi system", http://www.220-electronics.com/plasma/samsung-ps50a450-multisystem-plasma.htm Nov. 13, 2008.

Putman, Peter H., "There's Always a Better Mousetrap", http://www.hdtvexpert.com/pages/better.htm; download date Nov. 3, 2008; publication date Apr. 2005, pp. 1-7.

\* cited by examiner

GRAPHICAL POWER METER FOR CONSUMER TELEVISIONS

TECHNICAL FIELD

The present invention generally technically relates to power devices. More specifically, the present invention technically relates to power measurement and indication devices. Even more particularly, the present invention technically relates to graphical power meter devices.

BACKGROUND ART

Power meters are commonly used for measuring power consumption of electronic devices. A related art invention involves an apparatus for displaying electric power elements for a video display appliance that computes both a voltage and a current being actually applied to the device as well as the power consumption computed therefrom. This related art invention displays them in alphanumeric form on a screen.

Another related art invention involves a liquid crystal display (LCD) using a light-emitting diode (LED) source as backlighting. The power consumption is indicated in an alphanumeric form using a watts-meter. Yet another related art invention is a television having a power-saving mode that allows presetting a television (TV) to save on power usage. This power-saving mode uses "area-compensation" technology to provide options for setup, standby, and viewing of a TV. Yet another related art invention uses a large green light-emitting diode (LED) display of real-time power consumption in alphanumeric form as well.

In relation to power consumption, for example, the U.S. Environmental Protection Agency (EPA), the California Energy Commission (CEC), other governmental organizations (GOs), and non-government organizations (NGOs) maintain programs that provide standard methods to apprise a consumer of the energy consumption of a device. Such programs include on-line posting of information about energy consumption, on-line (Web-based) calculators to estimate energy consumption, and indirect recommendations for comparing the energy consumption on a product-to-product basis. These methods, however, are not directly used with the actual device in the related art, i.e., they are not in-situ.

As discussed, the EPA and other entities maintain programs that provide some standardized methods for apprising a consumer of the energy consumption of a device. However, these related art methods are often merely "estimations" of the anticipated use of a given device that is based on national averages for the price of power. In essence, the related art information provided to the consumer clearly does not reflect the "actual" power consumption. Further, professional installers of audio/video equipment must often "tune-up" a TV to improve the picture rendering qualities. The "tune-up" process involves adjusting colorimetry, brightness, and contrast settings to match the viewing environment. A large retailer often offers a service that adjusts the TV for lower energy consumption when compared to the factory settings. Such services require reliable power measurement equipment that consumers typically do not have.

What is absent in the related art is any genuine communication with consumers about energy consumption. Although manufacturers and retailers currently are required to provide some type of paper, e.g., a "hang tag" or display material with "White Goods," e.g., washers, dryers, refrigerators, and freezers, to inform the consumer about the estimated annual power use ("energy use guides"), such information does not illustrate the actual power consumption during various modes of operation. For example, if a consumer wants to evaluate a particular TV, in terms of its particular energy consumption, the manufacturer's data is not useful in terms of various modes of operation, i.e., this information might not represent the actual use mode(s) that the consumer intends.

However, these related art inventions have a shortcoming in that the displays are not graphical, but require the user to mentally recompute the displayed measurements from an alphanumeric form in order to fully understand the ramifications of the measurements. Thus, a long-felt need exists in the art for a graphical power meter that is interfaceable with consumer televisions, that can efficiently measure power consumption, that can graphically indicate the same to a user for streamlining the user's quick and easy understanding, that provides the consumer with increased knowledge regarding the power consumption of consumer electronics devices, and that can provide feedback to a plurality of related devices of an apparatus, such as a consumer television, for adjusting the power consumption via controlling at least one parameter, such as sound, brightness, parameters for setting a timer, and parameters for setting automatic switching.

SUMMARY OF THE INVENTION

The present invention addresses the foregoing concerns, e.g., the use of energy, the diminishing energy resources, and the lack of governmental rebates, the absence of in-situ evaluation, and the absence of feedback to the consumer, in a graphical power meter that uses a combination of hardware and software for measuring, controlling, and displaying power consumption of an electronic device. For convenience, the present invention graphically shows power consumption based on particular modes of operation that are actually consistent with the consumer's intent. Generally, the present invention power-meter graphically displays real-time power consumption of a device, such as a video device, an audio device, an audio/video (A/V) device, and a television device, e.g., a consumer television, during operation of the device. The present invention monitors the internal power consumption of the device and displays a consumer-accessible (user-friendly) graphical meter reading of the power consumed with the capability to adjust the power consumption based upon the consumer's preference.

The present invention graphical power meter generally comprises: a device for measuring, in real time, an internal power consumption value corresponding to power being consumed by an electronic device under at least one operational mode; and a device for displaying a graphical representation of the real-time internal power consumption value to at least one consumer. By example only, the real-time internal power consumption value may be indicated using an on-screen display (OSD) in units of kilowatt-hours (kWatt-hr). Some examples of consumer adjustable items include brightness, color, e.g., color saturation level, contrast, backlight level, video rendering style, e.g., "vivid," "cinema," and "standard," audio playback levels, etc. Based on a consumer's preferences, the graphical power meter facilitates a consumer's choices in adjusting parameters, such as brightness, contrast, etc., wherein the at least one consumer is encouraged to operate the electronic device in an environmentally-conscious energy-saving manner. The present graphical power meter may further comprise a graphical user interface (GUI) having a slider feature for facilitating entry, by a user, of user-selected parameters, wherein the slider feature may comprise a mouse, a remote control, and the like. The present invention also involves a corresponding method of fabrication of the graphical power meter device as well as a corresponding method of graphically displaying power consumption by way of a graphical power meter device.

In the present invention, a power measurement is made on a primary side of a power supply, wherein a current sensing circuitry is typically used for protection, e.g., surge protection, voltage-overprotect, etc. For example, the current sensing circuitry may turn-off the power supply when the secondary load exceeds a predetermined threshold limit. The current sensing circuitry also determines an input power consumption level. A power consumption level is derived from the current sensing circuitry; and an input voltage is conditioned, or translated and conveyed, to a secondary side of the power supply through either a coupling transformer or an optocoupler. The derived power consumption level is conveyed as a signal, such as an analog signal or a digital signal. The conveyed signal is then received by a processing unit that interprets the signal and determines the input power consumption level. When a user adjusts any feature related to the display, e.g., a cathode ray tube (CRT), a liquid crystal display (LCD), including a backlight display, a plasma display, a digital light processing (DLP) display, an organic light-emitting diode (OLED), etc., the real-time actual input power consumption level is indicated to the user via at least one technique.

Alternatively, a power measurement is made on a secondary side of a power supply, wherein a current sensing circuitry is applied to all outputs on the secondary side of the power supply. The power that is supplied by each secondary output is summed to determine the total output power. The summed power information is determined in a manner, such as a separate circuit and a monitor of a processing unit, wherein the summed power information is interpreted in relation to the input power consumption level being determined by the power conversion efficiency (η) of the power supply. When a user adjusts any feature related to the display, e.g., a cathode ray tube (CRT), a liquid crystal display (LCD), including a backlight display, a plasma display, a digital light processing (DLP) display, an organic light-emitting diode (OLED), etc., the real-time actual input power consumption level is indicated to the user via at least one technique.

The present invention methods involve a method of fabricating the graphical power meter and a method of using the graphical power meter by characterizing a real-time power consumption level of an electronic device, e.g., measuring and displaying power consumption levels by way of a graphical power meter. This method comprises characterizing the total power consumption level of the electronic device, the characterizing step comprising statistically sampling at least one aspect of the device's power consumption, thereby providing statistically sampled data, storing the statistically sampled data, wherein the at least one aspect comprises a low power level, a mid-range power level, and a high power level. Each user-controllable function, e.g., brightness, contrast, backlight, colorimetry, etc., is discretely characterized in relation to the system power consumption. For example, the power consumption by the brightness control is characterized at a minimum brightness level, an average brightness level, and a maximum brightness level for determining its contribution to the total power consumption. Data relating to this contribution is stored in memory. The same technique is used for all the user-controllable functions that contribute to total power consumption. As a user-controllable function is adjusted, the characterization data for each such user-controllable function is accessed from memory; and, through a computational algorithm based upon the system or device power consumption characteristics, the effect of the adjustment on power consumption is rationalized to approximate the actual input power. The rationalized value may be numerically represented as a power consumption level.

Advantages of the present invention include, but are not limited to, providing ease of 'in-store' demonstrations of an apparatus, e.g., a TV, providing consumers with the ability to see an accurate representation of the real-time power consumption of a TV based on different operational modes, promoting an environmentally-concerned "green" use of electronic devices, thereby facilitating consumers in the overall management of the carbon footprint otherwise left by use of electronic devices, providing compliance with respect to regulatory mandates for reduction in operational energy consumption, and providing the consumer with the affirmative ability to "take charge" of the consumer's own power consumption. Other features of the present invention are disclosed, or are apparent, in the section entitled "Mode(s) for Carrying-Out the Invention," disclosed, infra.

BRIEF DESCRIPTION OF THE DRAWINGS

For a better understanding of the present invention, reference is made to the below-referenced accompanying Drawing(s). Reference numbers refer to the same or equivalent parts of the present invention throughout the several figures of the Drawing(s).

MODE(S) FOR CARRYING-OUT THE INVENTION

Figure 1:
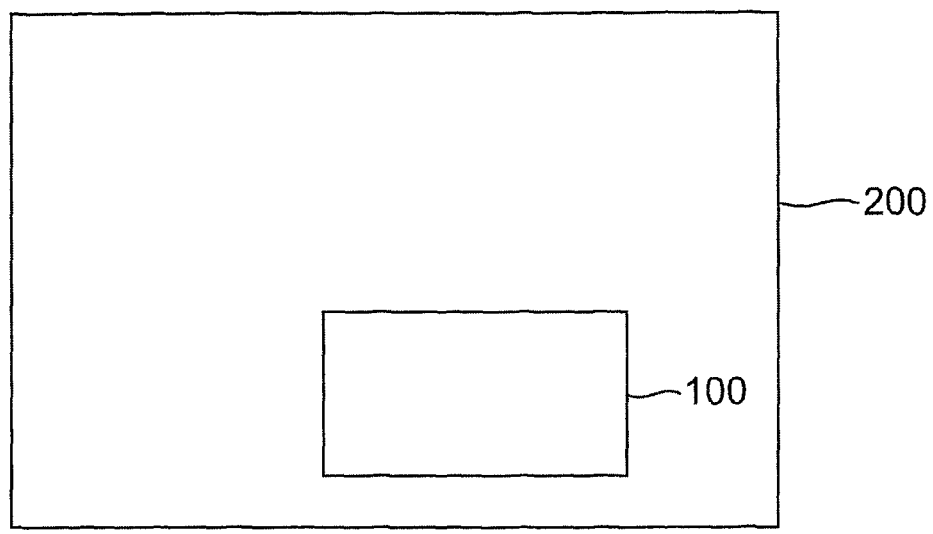
FIG. 1 is a schematic diagram of a graphical power meter in relation to an electronic device, in accordance with a first embodiment of the present invention.

FIG. 1, illustrates, in a schematic diagram, a graphical power meter 100 in relation to an electronic device 200, the graphical power meter 100 comprising a device for measuring (not shown), in real time, a power consumption value corresponding to power being consumed by an electronic device 200; and a device for displaying (not shown) a graphical representation (FIG. 3) of the real-time power consumption value to a consumer (not shown), in accordance with a first embodiment of the present invention. In the first embodiment, the graphical power meter 100 is integrally provided with the electronic device 200.

Figure 2:
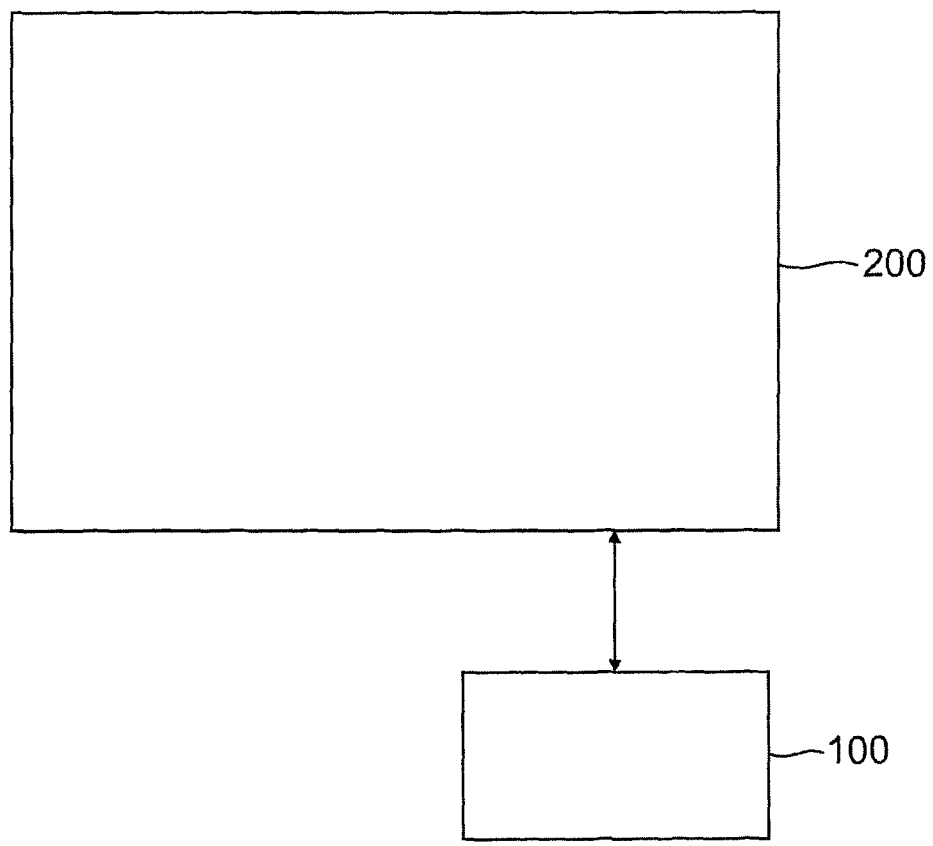
FIG. 2 is a schematic diagram of a graphical power meter in relation to an electronic device, in accordance with a second embodiment of the present invention.

FIG. 2, illustrates, in a schematic diagram, a graphical power meter 100 in relation to an electronic device 200, the graphical power meter 100 comprising a device for measuring (not shown), in real time, a power consumption value corresponding to power being consumed by an electronic device 200; and a device for displaying (not shown) a graphical representation (FIG. 3) of the real-time power consumption value to a consumer (not shown), in accordance with a second embodiment of the present invention. In the second embodiment, the graphical power meter 100 is separately provided for use with, and/or retrofit to, the electronic device 200.

Figure 3:
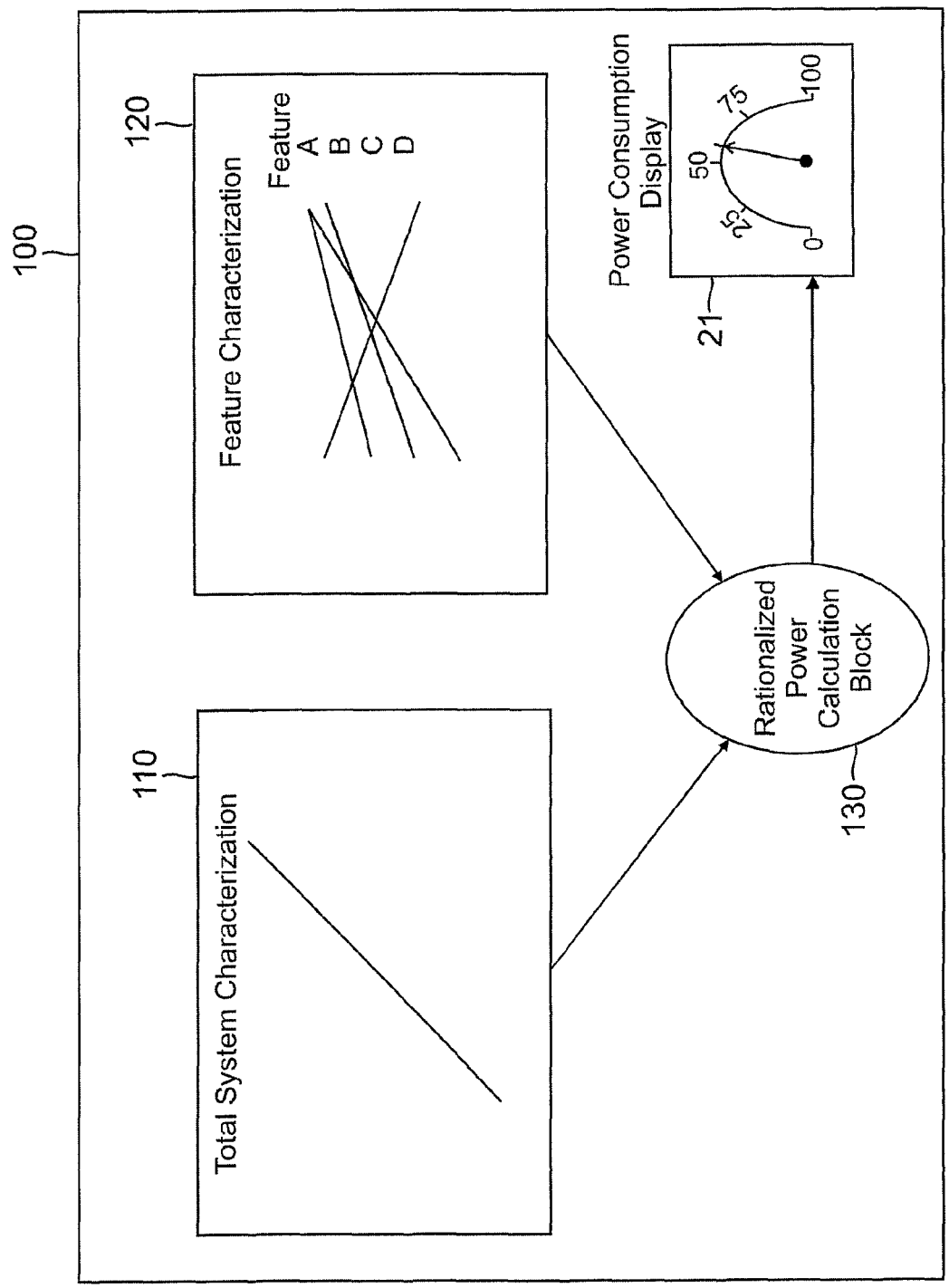
FIG. 3 is a schematic diagram of a graphical power meter for use with an electronic device, in accordance with the present invention.

FIG. 3, illustrates, in a schematic diagram, a graphical power meter 100 for use with an electronic device 200, the graphical power meter 100 comprising a device for measuring (not shown), in real time, a power consumption value corresponding to power being consumed by an electronic device 200; and a device for displaying (not shown) a graphical representation (FIG. 3) of the real-time power consumption value to a consumer (not shown), in accordance with the present invention. The graphical power meter 100 further comprises at least one online calculator (not shown) including a feature for presetting and storing a user's power budget information, e.g., for use in dormitories, hospitals, hotels, and other institutional settings. The graphical power meter 100 analyzes the total system characterization 110 of the electronic device 200 in relation to the feature characterization 120 of the electronic device 200 to determine a rationalized power calculation block 130, thereby providing data for the power consumption display 21, by example only. Also, the present invention graphical power meter 100 generally uses measurement techniques that complies with federal and state mandates.

The present invention is particularly useful during an 'in-store' demonstration of an electronic device 200, such as a television, wherein the present demonstration feature is readily interfaceable with any given electronic device 200 and is presented to the consumer in a user-friendly manner. Customers are able to see, and otherwise perceive, the real-time power consumption of the electronic device 200 based on different operational modes. Further, the consumer is offered, through a graphical page (not shown) on the electronic device 200, an option to either increase or decrease the power consumption of the electronic device 200, e.g., adjusting the power consumption of electronic device 200, by example only. Moreover, consumers will decrease the carbon footprint of their televisions, because they will be able to actively adjust the power consumption accordingly. The user's preferences may be optionally preset; and the output parameters of the electronic device 200 may thereby be automatically adjusted.

The present invention graphical power meter 100 facilitates user-selection of the brightness of the display among other features. The graphical power meter 100, when in operation in or on an electronic device 200, provides the consumer the option of using less or more power, depending on the user's choices and preferences. For example, if a user is interested in decreasing his/her carbon footprint, i.e., the extent to which the TV consumes or uses power, the user can opt to use less power by reading the display and then by adjusting the TV to reflect the user's preferences. Conversely, if a user is not concerned about his/her carbon footprint, the user can adjust the TV power consumption to the highest possible. Thus, the present invention provides the consumer with freedom and options for changing his/her carbon footprint.

The present invention foresees future consumers being increasingly aware of their environmental impact on power consumption via a power grid ("the mains"). As such, consumers may desire to operate their electronic devices 200 in a manner such that the picture or the image, e.g., of a TV, is not as bright as that of the default situation. Some sophisticated consumers may desire to adjust their power consumption as a function of their viewing content, especially, in relation to technology, such as digital television (DTV). By example only, if a consumer is merely "listening" to the morning news on a TV, the present invention provides the consumer with an option for downwardly adjusting the TV's power consumption by allowing, prompting, or automatically adjusting the display. Likewise, if the consumer is merely watching a sport, such as skiing or swimming, wherein only low contrast with significant details in the highlights would be desirable, the consumer can turn-down the display, by example only. This concept is applicable to other devices containing a display screen and rendering video.

The present invention also provides consumers with accurate knowledge of a given electronic device's power consumption when making purchasing decisions, such as during the aforementioned in-store demonstrations, and of the various settings for a given electronic device that affect its power consumption. The present invention further communicates with the consumer regarding the required regulations for energy efficiency and actual information about energy consumption, rather than merely declaring conformance thereto as is found in the related art.

In addition, the present invention graphical power meter 100 allows the consumer to better evaluate the power consumption in relation to the consumer's particular preferences, e.g., actively-selected, needs, and budget, as well as in relation to the other settings that are inherent to a given consumer device. Furthermore, the present invention real-time feature allows the consumer to monitor and adjust the power consumption in relation to the environment, e.g., ambient lighting, etc., as well. The present invention even allows the consumer to perform activities akin to those of a professional installer by allowing the consumer to finely adjust a given electronic device 200 to the consumer's use or viewing environment, thereby decreasing the cost of ownership.

By example only, a small graphical power meter 100 would have a graphical user interface (GUI). The GUI would comprise a display, e.g., a dial, a numerical dial, a dial coupled with units of measure, a bar-graph, a bar-graph coupled with numerical data, a bar-graph coupled with units of measure, a dual-axis graph, and a triple-axis graph, during a "demonstration mode" to indicate the real-time power consumption during each mode of operation. For example, TVs have various video modes that might represent a cinema experience or an enhanced mode that renders more vivid colors. Each of these modes involves a power consumption being different from a "standard" mode, i.e., that which is specified by the manufacturer. Additionally, the present invention graphical power meter 100 also comprises a feature for indicating the power consumption while adjusting the audio volume level or other adjustable parameters of the electronic device 200.

The graphical power meter 100 may further include an audible feature comprising a sound, such as a beeping or a speech output. The power consumption data is verbalized as well as being shown graphically in a manner such as the electronic device 200 being adapted to send a verbal message, e.g., "Your power consumption is currently X." The audible feature is also capable of communicating information about setups as well as power consumption, e.g., an informational element such as a real-time internal energy consumption value and setup information. The audible feature would also assist consumers having visual impairments as well as an audible level that may be variable and be hearing-aid-compatible (HAC) for the hearing impaired. The graphical power meter 100 display may hearing-assistive for the hearing-impaired as it may also comprise closed-captioning. The audible feature may also be compatible with Assistive Technology (AT) and conform to federally regulated telecommunications and rehabilitation requirements. The graphical power meter 100 may further comprise an olfactory-perceivable feature, such as a feature for emitting a "green" scent or any other pleasant scent which evokes "nature." Alternatively, the graphical power meter 100 may provide a menu from which the user may select a scent; and the olfactory-perceivable feature may comprise a consumer-selected scent that communicates that the electronic device is operating most energy-efficiently under a given set of user-preferences. The foregoing alternative indication features may assist the disabled and senior citizens.

Figure 4:
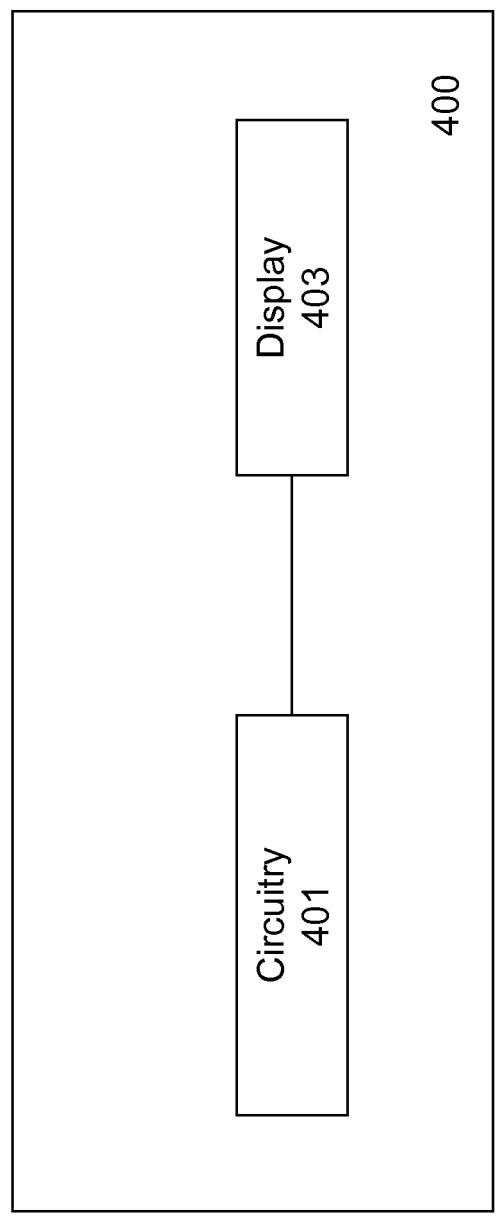
FIG. 4 is a schematic diagram of a graphical power meter in accordance with some embodiments of the present invention.

Now referring to FIG. 4, a graphical power meter according to one or more embodiments is shown. The graphical power meter 400 includes circuitry 401 and a display 403. The circuitry 401 is adapted to measures an internal power consumption value corresponding to power being consumed by an electronic device. The circuitry 401 may be a current sensing circuitry. The display 403 is adapted to display a graphical representation of the real time internal power consumption value from the circuitry.

Figure 5:
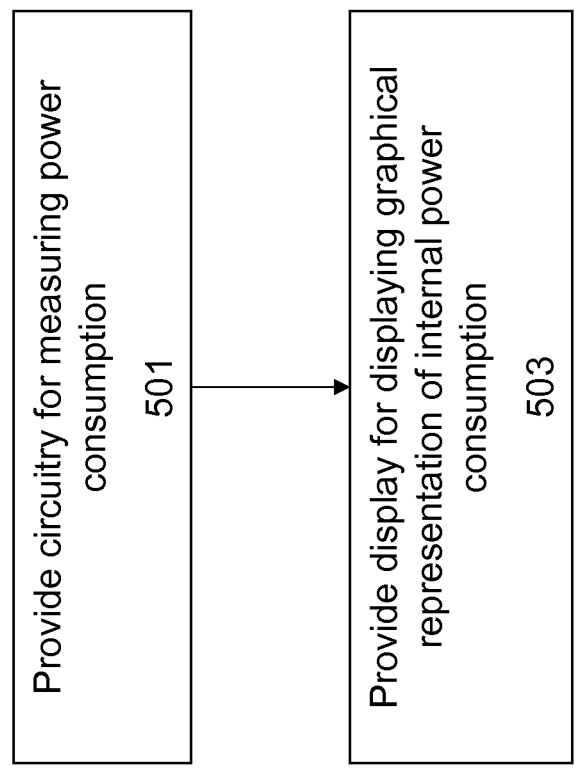
FIG. 5 is a flow diagram of a process for fabricating a graphical power meter in accordance with some embodiments of the present invention.

Now referring to FIG. 5, a method for fabricating a graphical power meter is shown. In step 501, circuitry for measuring power consumption is provided. In step 503, a display for displaying graphical representation of internal power consumption value is provided.

Figure 6:
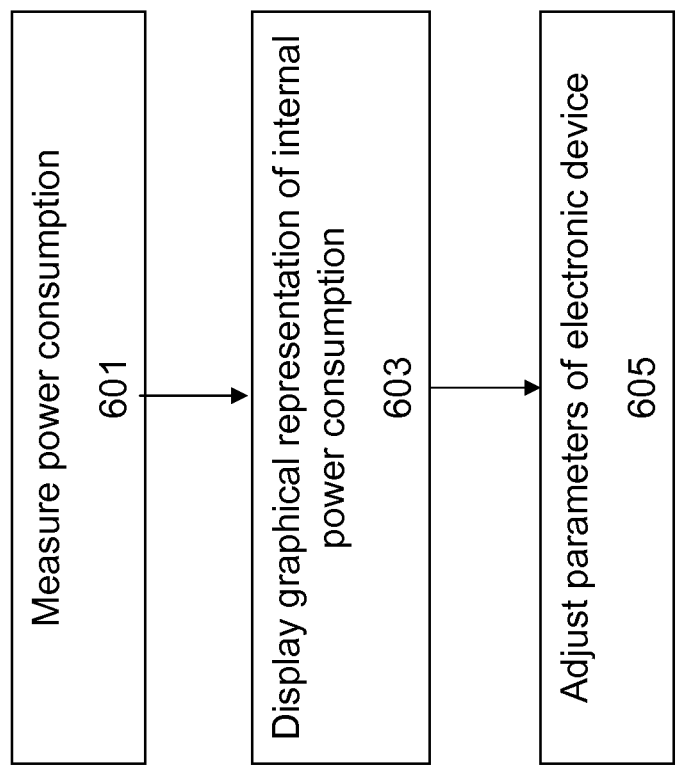
FIG. 6 is a flow diagram of a process for measuring and graphically displaying power consumption by way of a graphical power meter in accordance with some embodiments of the present invention.

Finally referring to FIG. 6, a method for measuring and graphically displaying power consumption is shown. In step 601, power consumption is measured. In step 603, graphical representation of internal power consumption is displayed. In step 605, at least one parameter of electronic device is adjusted.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, that various changes and modifications in form, material, and fabrication material detail may be made, without departing from the spirit and scope of the invention as set forth in the appended claims, should be readily apparent to those of ordinary skill in the art. No claim herein is to be construed under the provisions of 35 U.S.C. §112, sixth paragraph, unless the element is expressly recited using the phrase "means for."

INDUSTRIAL APPLICABILITY

The present invention generally industrially applies to power devices. More specifically, the present invention industrially applies to power measurement and indication devices. Even more particularly, the present invention industrially applies to graphical power meter devices.

What is claimed:

1. A graphical power meter comprising:
a circuitry for measuring, in real time, an internal power consumption value of an electronic device by statistically sampling one or more aspects of power consumption of the electronic device, wherein the one or more aspects comprise one or more of: a low power level, a mid-range power level and a high power level; and
a display for displaying a graphical representation of the real-time internal power consumption value from the circuitry to one or more consumers,
wherein the display comprises a graphic user interface,
wherein the graphic user interface comprises one or more input features and one or more output features,
wherein the one or more input features comprises one or more of: a window for facilitating entry of user-preset parameters and one or more slider features,
wherein the one or more output features, which facilitate adjusting of the internal power consumption using one or more consumer preferences, comprise a visual indication, an audible indication, and a scent indication,
wherein the visual indication comprises one or more of: a dial, a numerical dial, a dial coupled with units of measure, a bar-graph, a bar-graph coupled with numerical data, a bar-graph coupled with units of measure, a dual-axis graph, and a triple-axis graph,
wherein the audible indication comprises one or more of: a speech output and an adjustable sound adaptable for the hearing-impaired,
wherein the scent indication comprises one or more of: a pleasant natural scent, a "green" scent, a pleasant scent, and a consumer-selected scent,
wherein the one or more consumer preferences comprise one or more of: a brightness level, a contrast level, a color level, a saturation level, a backlight level, a video rendering style, and an audio playback level,
wherein the circuitry is disposed on one of: a primary side of a power supply and a secondary side of the power supply,
wherein a current sensing circuitry switches-off the power supply when a secondary load exceeds a predetermined threshold,
wherein the display further comprises a feature for facilitating selection of one or more energy-saving preferences, and
wherein the one or more energy-saving preferences are a function of one or more of: a user's actively-selected preference, a user's need, a user's budget, a setting inherent to the electronic device, and a viewing environment.

2. A graphical power meter, as recited in claim 1, wherein the electronic device comprises one or both of: an audio feature and a visual feature.

3. A graphical power meter, as recited in claim 1, wherein the electronic device comprises a television.

4. A graphical power meter, as recited in claim 1, wherein the electronic device comprises a set-top box.

5. A graphical power meter, as recited in claim 1, wherein the audible indication further comprises one or more of: a beeping sound, a sound being in conformance with a hearing assistive technology, and a sound in conformance with one or more federally-regulated telecommunication and rehabilitation requirements.

6. A graphical power meter, as recited in claim 1, wherein the speech output comprises one or more informational elements, wherein the one or more informational elements comprise a real-time internal energy consumption value and setup information.

7. A graphical power meter, as recited in claim 1, wherein the video rendering style comprises one or more of: a vivid display, a cinema display, and a standard display.

8. A graphical power meter, as recited in claim 1, wherein the graphical power meter is used in an in-store demonstration of the electronic device.

9. A graphical power meter, as recited in claim 1,
wherein the circuitry is applied to one or more outputs on the secondary side, a summation of the power supplied by the one or more outputs determining a total output power, the summation being made by one or both of: the current sensing circuit and a processing unit monitor, the total output power being further determined by an input power consumption level, and the input power consumption level being determined by a power conversion efficiency of the power supply.

10. A graphical power meter, as recited in claim 1, wherein the display comprises an on-screen display.

11. A graphical power meter, as recited in claim 1, wherein the display further comprises a feature for facilitating selection of a visual indication feature.

12. A graphical power meter, as recited in claim 1,
wherein the one or more consumers are encouraged to operate the electronic device in an environmentally-conscious energy-saving manner, and
wherein the one or more consumers participate in an overall management of a carbon footprint of the electronic device.

13. A graphical power meter comprising:
circuitry for measuring, in real time, an internal power consumption value corresponding to power being consumed by an electronic device under at least one operational mode; and
a display for displaying a graphical representation of the real-time internal power consumption value from the circuitry to at least one consumer,
wherein the graphical representation comprises at least one feature selected from a group consisting essentially of a dial, a numerical dial, a dial coupled with units of measure, a bar-graph, a bar-graph coupled with numerical data, a bar-graph coupled with units of measure, a dual-axis graph, and a triple-axis graph,
wherein the electronic device comprises at least one feature selected from a group consisting essentially of an audio feature and a visual feature,
wherein the electronic device comprises a television,
wherein the circuitry comprises a measurement device adapted for use with a measurement technique,
wherein the measurement technique is adapted for use with a set-top box,
wherein the display comprises a graphic user interface,
wherein the graphic user interface comprises:
at least one input feature; and
at least one output feature,
wherein the at least one input feature comprises at least one feature selected from a group consisting essentially of a window for facilitating entry of user-preset parameters and at least one slider feature,
wherein the at least one output feature comprises at least one feature selected from a group consisting essentially of a visual indication, an audible indication, and a scent indication,
wherein the visual indication comprises at least one feature selected from a group consisting essentially of a dial, a numerical dial, a dial coupled with units of measure, a bar-graph, a bar-graph coupled with numerical data, a bar-graph coupled with units of measure, a dual-axis graph, and a triple-axis graph,
wherein the audible indication comprises at least one feature selected from a group consisting essentially of a beeping sound, a speech output, an adjustable sound adaptable for the hearing-impaired, a sound being in conformance with a hearing-assistive technology, and a sound in conformance with at least one federally-regulated telecommunication and rehabilitation requirement,
wherein the speech output comprises at least one informational element selected from a group consisting essentially of a real-time internal energy consumption value and setup information,
wherein the scent indication comprises at least one element selected from a group consisting essentially of a pleasant natural scent, a "green" scent, a pleasant scent, and a consumer-selected scent,
wherein the at least one output feature facilitates adjusting the internal power consumption using at least one consumer preference,
wherein the at least one consumer preference comprises at least one parameter selected from a group consisting essentially of brightness, contrast, color, saturation level, a backlight level, video rendering style, and audio playback levels,
wherein the video rendering style comprises at least one element selected from a group consisting essentially of a vivid display, a cinema display, and a standard display,
wherein the electronic device undergoes an in-store demonstration,
wherein the circuitry is disposed in a manner selected from a group consisting essentially of a primary side of a power supply and a secondary side of a power supply,
wherein a current sensing circuitry switches-off the power supply if a secondary load exceeds a predetermined threshold,
wherein a current sensing circuitry is applied to at least one output on the secondary side, a summation of the power supplied by the at least one output determining a total output power, the summation being made by at least one element selected from a group consisting essentially of a circuit and a processing unit monitor, the total output power being further determined by an input power consumption level, and the input power consumption level being determined by a power conversion efficiency of the power supply,
wherein the display comprises an on-screen display,
wherein the display further includes at least one element selected from a group consisting essentially of a feature for facilitating selection of a visual indication feature and a feature for facilitating selection of at least one energy-saving preference,
wherein the at least one consumer is encouraged to operate the electronic device in an environmentally-conscious energy-saving manner,
wherein the at least one consumer participates in an overall management of a carbon footprint of the electronic device, and
wherein the at least one energy-saving preference is a function of at least one element selected from a group consisting essentially of a user's actively-selected preference, a user's need, a user's budget, a setting inherent to the electronic device, and a viewing environment.

14. A method of measuring and graphically displaying power consumption, the method comprising:
- measuring, in real time, an internal power consumption value of an electronic device by statistically sampling one or more aspects of the power consumption of the electronic device, wherein the one or more aspects comprise one or more of: a low power level, a mid-range power level and a high power level; and
- displaying, on a display, a graphical representation of the real-time internal power consumption value to one or more consumers,
- wherein the display comprises a graphic user interface,
- wherein the graphic user interface comprises one or more input features and one or more output features,
- wherein the one or more input features comprises one or more of a window for facilitating entry of user-preset parameters and one or more slider features,
- wherein the one or more output features, which facilitate adjusting of the internal power consumption using one or more consumer preference, comprise a visual indication, an audible indication, and a scent indication,
- wherein the visual indication comprises one or more of: a dial, a numerical dial, a dial coupled with units of measure, a bar-graph, a bar-graph coupled with numerical data, a bar-graph coupled with units of measure, a dual-axis graph, and a triple-axis graph,
- wherein the audible indication comprises one or more of: a speech output and an adjustable sound adaptable for the hearing-impaired,
- wherein the scent indication comprises one or more of: a pleasant natural scent, a "green" scent, a pleasant scent, and a consumer-selected scent, and
- wherein the one or more consumer preferences comprises one or more of: a brightness level, a contrast level, a color level, a saturation level, a backlight level, a video rendering style, and an audio playback level.

* * * * *